United States Patent
Hashim

(10) Patent No.: US 7,168,993 B2
(45) Date of Patent: Jan. 30, 2007

(54) COMMUNICATIONS CONNECTOR WITH FLOATING WIRING BOARD FOR IMPARTING CROSSTALK COMPENSATION BETWEEN CONDUCTORS

(75) Inventor: Amid Hashim, Plano, TX (US)

(73) Assignee: CommScope Solutions Properties LLC, Sparks, NV (US)

( * ) Notice: Subject to any disclaimer, the term of this patent is extended or adjusted under 35 U.S.C. 154(b) by 0 days.

(21) Appl. No.: 11/139,768

(22) Filed: May 27, 2005

(65) Prior Publication Data

US 2006/0121789 A1 Jun. 8, 2006

(51) Int. Cl.
*H01R 24/00* (2006.01)

(52) U.S. Cl. .................................... 439/676

(58) Field of Classification Search ........... 439/676, 439/941, 418, 395, 344
See application file for complete search history.

(56) References Cited

U.S. PATENT DOCUMENTS

| | | | |
|---|---|---|---|
| 5,186,647 A | | 2/1993 | Denkmann et al. |
| 5,328,390 A | | 7/1994 | Johnston et al. |
| 5,397,862 A | | 3/1995 | Bockelman et al. |
| 5,571,035 A | | 11/1996 | Ferrill |
| 5,915,989 A | | 6/1999 | Adriaenssens et al. |
| 5,921,818 A | | 7/1999 | Larsen et al. |
| 5,947,772 A | | 9/1999 | Arnett et al. |
| 5,961,354 A | | 10/1999 | Hashim |
| 5,967,853 A | | 10/1999 | Hashim |
| 5,975,919 A | | 11/1999 | Arnett et al. |
| 5,989,071 A | | 11/1999 | Larsen et al. |
| 5,997,358 A | * | 12/1999 | Adriaenssens et al. ...... 439/676 |
| 6,042,427 A | * | 3/2000 | Adriaenssens et al. ...... 439/676 |
| 6,050,843 A | | 4/2000 | Adriaenssens et al. |
| 6,102,730 A | | 8/2000 | Kjeldahl et al. |
| 6,116,964 A | * | 9/2000 | Goodrich et al. ........... 439/676 |
| 6,165,023 A | | 12/2000 | Troutman et al. |
| 6,170,154 B1 | | 1/2001 | Swarup |
| 6,186,834 B1 | | 2/2001 | Arnett et al. |

(Continued)

FOREIGN PATENT DOCUMENTS

EP        0 525 703 B1      2/1993

(Continued)

OTHER PUBLICATIONS

Belden CDT Networking Data Sheet for the 10GX Module www.BeldenIBDN.com.

*Primary Examiner*—Chandrika Prasad
(74) *Attorney, Agent, or Firm*—Myers Bigel Sibley & Sajovec

(57) ABSTRACT

A communications connector includes: a dielectric mounting substrate; a plurality of conductors mounted in the mounting substrate; and a wiring board. Each of the conductors includes a fixed end portion mounted in the mounting substrate and a free end portion, each of the free end portions being positioned in side-by-side and generally parallel relationship, and each of the fixed end portions being positioned in side-by side and generally parallel relationship. The wiring board is positioned between the fixed and free end portions of the conductors, the wiring board being generally perpendicular to the conductors, the wiring board including first and second conductive traces that are electrically insulated from each other. First and second conductors are electrically connected with the first and second traces. The first and second conductive traces are arranged on the wiring board to create a crossover between the first and second conductors.

44 Claims, 11 Drawing Sheets

U.S. PATENT DOCUMENTS

| | | |
|---|---|---|
| 6,196,880 B1 * | 3/2001 | Goodrich et al. ........... 439/676 |
| 6,238,235 B1 | 5/2001 | Shavit et al. |
| 6,270,358 B1 | 8/2001 | Nozick |
| 6,270,381 B1 | 8/2001 | Adriaenssens et al. |
| 6,312,290 B1 | 11/2001 | Belopolsky |
| 6,350,158 B1 * | 2/2002 | Arnett et al. ............... 439/676 |
| 6,353,540 B1 | 3/2002 | Akiba et al. |
| 6,356,162 B1 | 3/2002 | Deflandre et al. |
| 6,364,694 B1 | 4/2002 | Lien |
| 6,379,157 B1 | 4/2002 | Curry et al. |
| 6,407,542 B1 | 6/2002 | Conte |
| 6,428,362 B1 | 8/2002 | Phommachanh |
| 6,443,776 B2 | 9/2002 | Reichle |
| 6,454,541 B1 | 9/2002 | Ijiri et al. |
| 6,464,529 B1 | 10/2002 | Jensen et al. |
| 6,520,807 B2 | 2/2003 | Winings |
| 6,524,128 B2 | 2/2003 | Marowsky et al. |
| 6,530,810 B2 | 3/2003 | Goodrich |
| 6,558,204 B1 | 5/2003 | Weatherley |
| 6,558,207 B1 | 5/2003 | Pepe et al. |
| 6,561,838 B1 | 5/2003 | Blichfeldt |
| 6,571,187 B1 | 5/2003 | Conte |
| 6,647,357 B1 | 11/2003 | Conte |
| 6,764,348 B2 | 7/2004 | Han et al. |
| 6,811,442 B1 | 11/2004 | Lien et al. |
| 6,962,503 B2 | 11/2005 | Aekins |
| 2001/0018287 A1 | 8/2001 | Reichle |
| 2001/0021608 A1 | 9/2001 | Borbolla et al. |
| 2001/0048592 A1 | 12/2001 | Nimomiya |
| 2002/0088977 A1 | 7/2002 | Mori et al. |
| 2003/0129880 A1 | 7/2003 | Arnett et al. |
| 2004/0002267 A1 | 1/2004 | Hatterscheid et al. |
| 2005/0254223 A1 | 11/2005 | Hashim |
| 2006/0121788 A1 | 6/2006 | Pharney |
| 2006/0121789 A1 | 6/2006 | Hashim |
| 2006/0160428 A1 | 7/2006 | Hashim |

FOREIGN PATENT DOCUMENTS

| | | |
|---|---|---|
| EP | 0 901 201 | 3/1999 |
| EP | 1 059 704 | 12/2000 |
| EP | 1 191 646 | 3/2002 |
| EP | 1 435 679 | 7/2004 |
| WO | WO 94/05092 | 3/1994 |
| WO | WO 99/53574 | 10/1999 |
| WO | WO 2003-019734 | 3/2003 |
| WO | WO 03/090322 | 10/2003 |

* cited by examiner

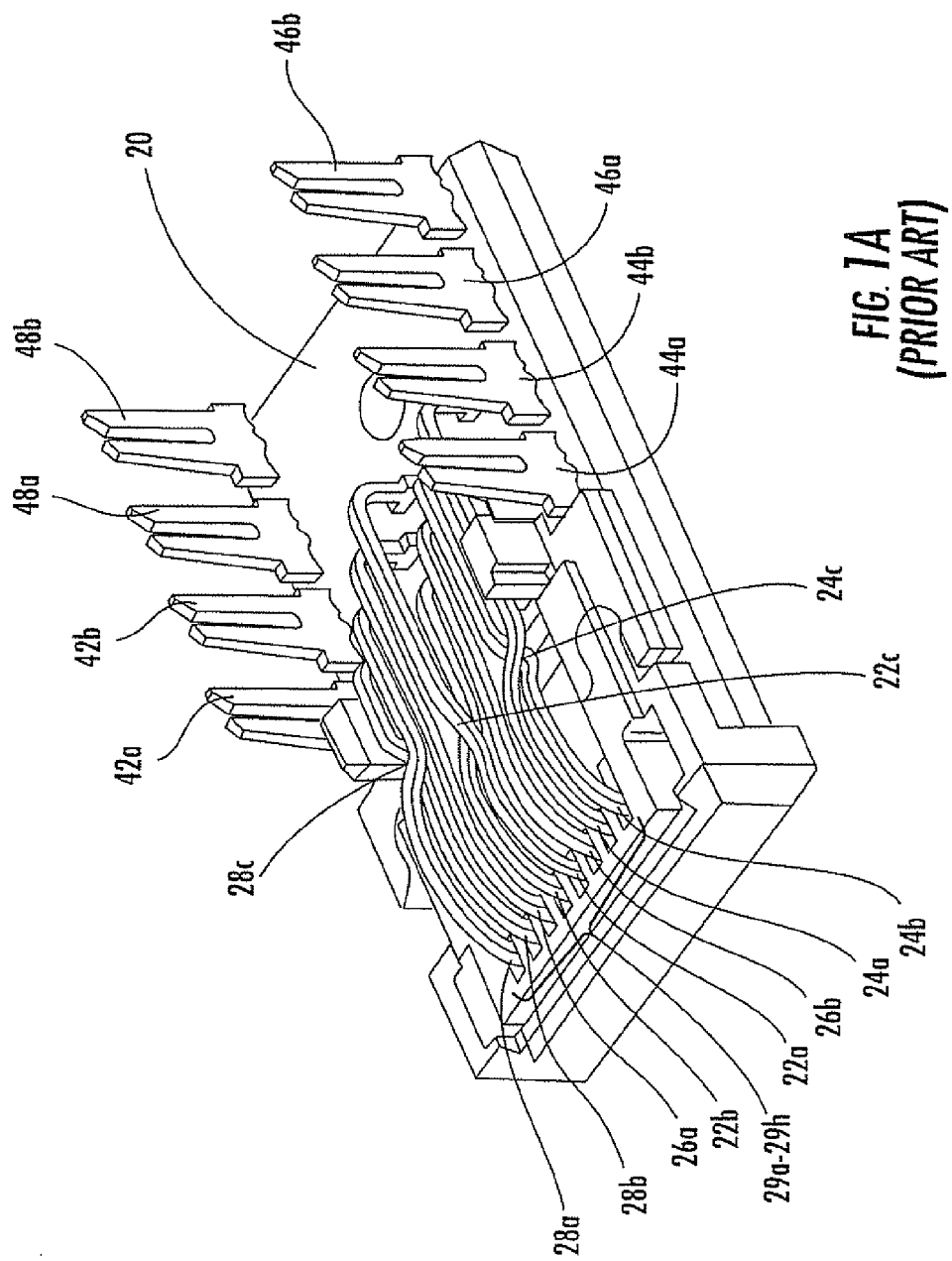

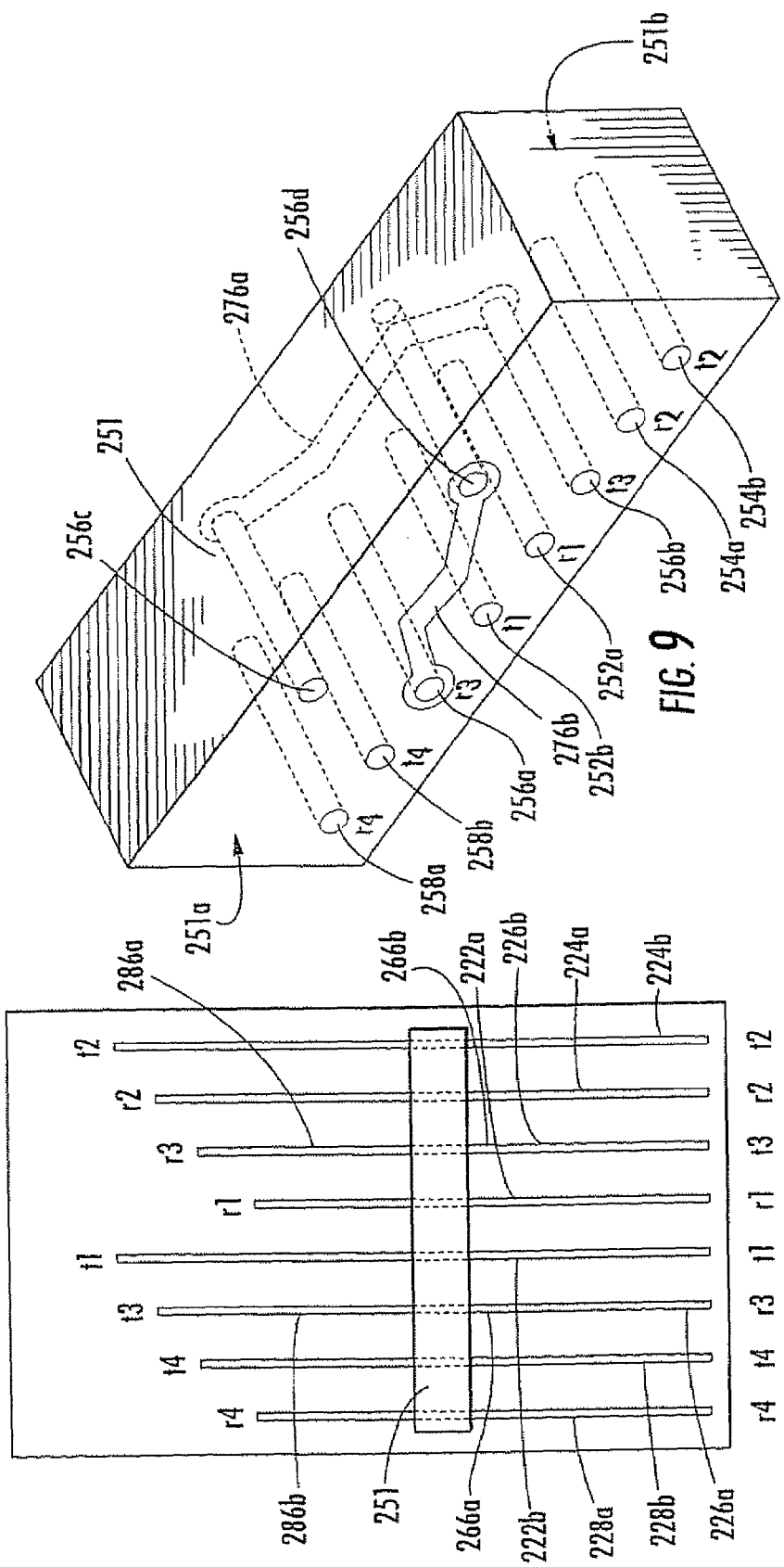

COMMUNICATIONS CONNECTOR WITH FLOATING WIRING BOARD FOR IMPARTING CROSSTALK COMPENSATION BETWEEN CONDUCTORS

FIELD OF THE INVENTION

The present invention relates generally to communication connectors and more particularly to near-end crosstalk (NEXT) and far-end crosstalk (FEXT) compensation in communication connectors.

BACKGROUND OF THE INVENTION

In an electrical communication system, it is sometimes advantageous to transmit information signals (video, audio, data) over a pair of wires (hereinafter "wire-pair" or "differential pair") rather than a single wire, wherein the transmitted signal comprises the voltage difference between the wires without regard to the absolute voltages present. Each wire in a wire-pair is susceptible to picking up electrical noise from sources such as lightning, automobile spark plugs and radio stations to name but a few. Because this type of noise is common to both wires within a pair, the differential signal is typically not disturbed. This is a fundamental reason for having closely spaced differential pairs.

Of greater concern, however, is the electrical noise that is picked up from nearby wires or pairs of wires that may extend in the same general direction for some distances and not cancel differentially on the victim pair. This is referred to as crosstalk. Particularly, in a communication system involving networked computers, channels are formed by cascading plugs, jacks and cable segments. In such channels, a modular plug often mates with a modular jack, and the proximities and routings of the electrical wires (conductors) and contacting structures within the jack and/or plug also can produce capacitive as well as inductive couplings that generate near-end crosstalk (NEXT) (i.e., the crosstalk measured at an input location corresponding to a source at the same location) as well as far-end crosstalk (FEXT) (i.e., the crosstalk measured at the output location corresponding to a source at the input location). Such crosstalks occur from closely-positioned wires over a short distance. In all of the above situations, undesirable signals are present on the electrical conductors that can interfere with the information signal. When the same noise signal is added to each wire in the wire-pair, the voltage difference between the wires will remain about the same and differential cross-talk is not induced, while at the same time the average voltage on the two wires with respect to ground reference is elevated and common mode crosstalk is induced. On the other hand, when an opposite but equal noise signal is added to each wire in the wire pair, the voltage difference between the wires will be elevated and differential crosstalk is induced, while the average voltage on the two wires with respect to ground reference is not elevated and common mode crosstalk is not induced.

U.S. Pat. No. 5,997,358 to Adriaenssens et al. (hereinafter "the '358 patent") describes a two-stage scheme for compensating differential to differential NEXT for a plug-jack combination (the entire contents of the '358 patent are hereby incorporated herein by reference, as are U.S. Pat. Nos. 5,915,989; 6,042,427; 6,050,843; and 6,270,381). Connectors described in the '358 patent can reduce the internal NEXT (original crosstalk) between the electrical wire pairs of a modular plug by adding a fabricated or artificial crosstalk, usually in the jack, at one or more stages, thereby canceling or reducing the overall crosstalk for the plug-jack combination. The fabricated crosstalk is referred to herein as a compensation crosstalk. This idea can often be implemented by twice crossing the path of one of the differential pairs within the connector relative to the path of another differential pair within the connector, thereby providing two stages of NEXT compensation. This scheme can be more efficient at reducing the NEXT than a scheme in which the compensation is added at a single stage, especially when the second and subsequent stages of compensation include a time delay that is selected to account for differences in phase between the offending and compensating crosstalk. This type of arrangement can include capacitive and/or inductive elements that introduce multi-stage crosstalk compensation, and is typically employed in jack lead frames and PWB structures within jacks. These configurations can allow connectors to meet "Category 6" performance standards set forth in ANSI/EIA/TIA 568, which are primary component standards for mated plugs and jacks for transmission frequencies up to 250 MHz.

Alien NEXT is the differential crosstalk that occurs between communication channels. Obviously, physical separation between jacks will help and/or typical crosstalk approaches may be employed. However, a problem case may be "pair 3" of one channel crosstalking to "pair 3" of another channel, even if the pair 3 plug and jack wires in each channel are remote from each other and the only coupling occurs between the routed cabling. To reduce this form of alien NEXT, shielded systems containing shielded twisted pairs or foiled twisted pair configurations may be used. However, the inclusion of shields can increase cost of the system. Another approach to reduce or minimize alien NEXT utilizes spatial separation of cables within a channel and/or spatial separation between the jacks in a channel. However, this is typically impractical because bundling of cables and patch cords is common practice due to "real estate" constraints and ease of wire management.

In spite of recent strides made in improving mated connector (i.e., plug-jack) performance, and in particular reducing crosstalk at elevated frequencies (e.g., 500 MHz—see U.S. patent application Ser. No. 10/845,104, entitled NEXT High Frequency Improvement by Using Frequency Dependent Effective Capacitance, filed May 4, 2004, the disclosure of which is hereby incorporated herein by reference), channels utilizing connectors that rely on either these teachings or those of the '358 patent can still exhibit unacceptably high alien NEXT at very high frequencies (e.g., 500 MHz). As such, it would be desirable to provide connectors and channels used thereby with reduced alien NEXT at very high frequencies.

SUMMARY OF THE INVENTION

The present invention can provide communications jacks with improved differential to common mode and differential to differential NEXT and FEXT performance, particularly at high frequencies. As a first aspect, embodiments of the present invention are directed to a communications connector, comprising: a dielectric mounting substrate; a plurality of conductors mounted in the mounting substrate; and a wiring board. Each of the conductors includes a fixed end portion mounted in the mounting substrate and a free end portion, each of the free end portions being positioned in side-by-side and generally parallel relationship, and each of the fixed end portions being positioned in side-by side and generally parallel relationship. The wiring board is positioned between the fixed and free end portions of the conductors, the wiring board being generally perpendicular to the conductors. The wiring board includes a first conductive trace. A first of the plurality of conductors is electrically connected with the trace such that the fixed end portion and the free end portion of the first conductor are in non-aligned relationship. In this configuration, the wiring board can be used to provide changes in direction to the first conductor, particularly if the first conductor is to cross over another conductor to compensate for crosstalk.

In some embodiments, the wiring board is a "floating" wiring board that is suspended above and spaced from the mounting substrate. This configuration enables the wiring board to move with the conductors when they deflect in response interconnection with another connector.

As a second aspect, embodiments of the present invention are directed to a communications connector, comprising: a dielectric mounting substrate; a plurality of conductors mounted in the mounting substrate; and a wiring board. Each of the conductors includes a fixed end portion mounted in the mounting substrate and a free end portion, each of the free end portions being positioned in side-by-side and generally parallel relationship, and each of the fixed end portions being positioned in side-by side and generally parallel relationship. The wiring board is positioned between the fixed and free end portions of the conductors, the wiring board being generally perpendicular to the conductors, the wiring board including first and second conductive traces that are electrically insulated from each other. A first conductor is electrically connected with the first trace, and a second conductor is electrically connected with the second trace, such that the fixed end portion of the first conductor and the free end portion of the second conductor are substantially aligned, and the fixed end portion of the second conductor and the free end portion of the first conductor are substantially aligned. Thus, this configuration can enable conductors to be desirably crossed over each other.

As a third aspect, embodiments of the present invention are directed to a communications connector, comprising: a dielectric mounting substrate; a plurality of conductors mounted in the mounting substrate; and a wiring board. Each of the conductors includes a fixed end portion mounted in the mounting substrate and a free end portion, each of the free end portions being positioned in side-by-side and generally parallel relationship, and each of the fixed end portions being positioned in side-by side and generally parallel relationship. The wiring board is positioned between the fixed and free end portions of the conductors, the wiring board being generally perpendicular to the conductors, the wiring board including first and second conductive traces that are electrically insulated from each other. First and second conductors are electrically connected with the first and second traces. The first and second conductive traces are arranged on the wiring board to create a crossover between the first and second conductors.

BRIEF DESCRIPTION OF THE FIGURES

FIG. 1A is an enlarged perspective view of the prior art communications jack of FIG. 1.

FIG. 8 is a partial top view of the jack of FIG. 6.

FIG. 9 is an enlarged perspective view of the floating printed wiring board of the jack of FIG. 6.

DETAILED DESCRIPTION OF EMBODIMENTS OF THE INVENTION

Figure 1:
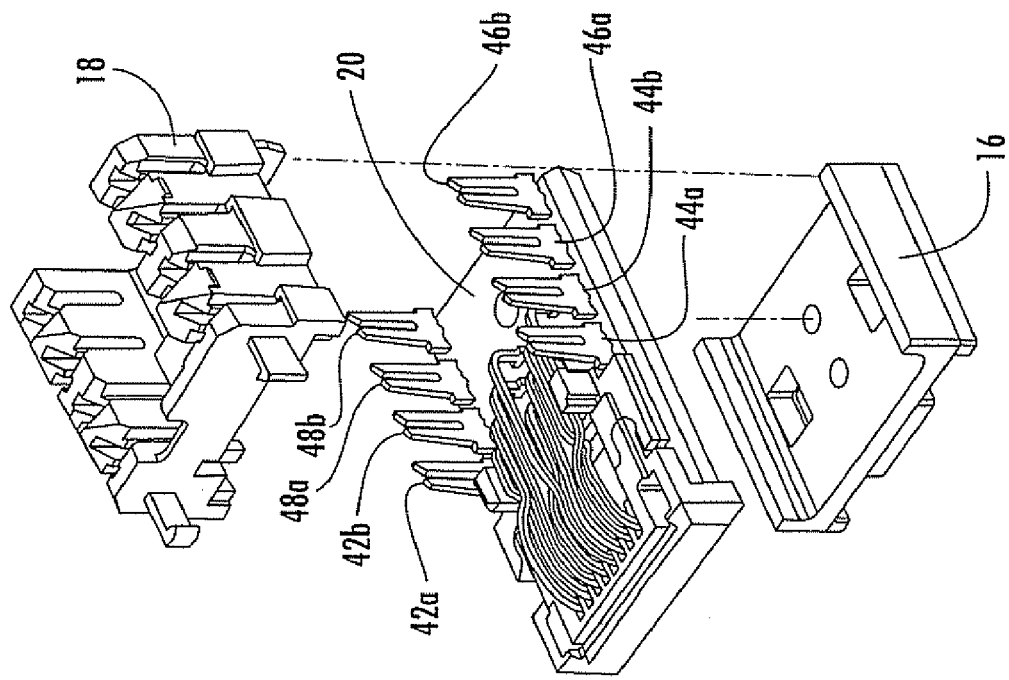
FIG. 1 is an exploded perspective view of a prior art communications jack.
Figure 1:
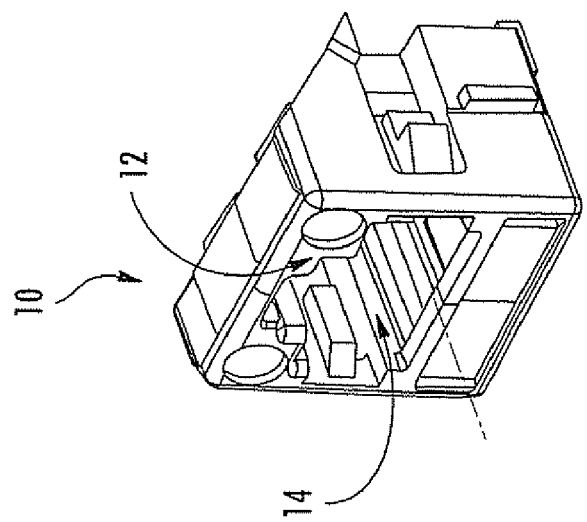

The present invention will be described more particularly hereinafter with reference to the accompanying drawings. The invention is not intended to be limited to the illustrated embodiments; rather, these embodiments are intended to fully and completely disclose the invention to those skilled in this art. In the drawings, like numbers refer to like elements throughout. Thicknesses and dimensions of some components may be exaggerated for clarity.

It will be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present. Like numbers refer to like elements throughout. As used herein the term "and/or" includes any and all combinations of one or more of the associated listed items.

In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Well-known functions or constructions may not be described in detail for brevity and/or clarity.

As used herein the expression "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

This invention is directed to communications connectors, with a primary example of such being a communications jack. As used herein, the terms "forward", "forwardly", and "front" and derivatives thereof refer to the direction defined by a vector extending from the center of the jack toward the plug opening of the jack. Conversely, the terms "rearward", "rearwardly", and derivatives thereof refer to the direction directly opposite the forward direction; the rearward direction is defined by a vector that extends away from the plug opening toward the remainder of the jack. The terms "lateral," "laterally", and derivatives thereof refer to the direction generally parallel with the plane defined by a wiring board on which jack contact wires are mounted and extending away from a plane bisecting the plug in the center. The terms "medial," "inward," "inboard," and derivatives thereof refer to the direction that is the converse of the lateral direction, i.e., the direction parallel with the plane defined by the wiring board and extending from the periphery of the jack toward the aforementioned bisecting plane. Where used, the terms "attached", "connected", "interconnected", "contacting", "mounted" and the like can mean either direct or indirect attachment or contact between elements, unless stated otherwise. Where used, the terms "coupled," "induced" and the like can mean non-conductive interaction, either direct or indirect, between elements or between different sections of the same element, unless stated otherwise.

Referring now to the figures, a prior art jack, designated broadly at 10, is illustrated in FIGS. 1 and 1A. The jack 10 includes a jack frame 12 having a plug aperture 14 for receiving a mating plug, a cover 16 and a terminal housing 18. These components are conventionally formed and not need be described in detail herein; for a further description of these components and the manner in which they interconnect, see U.S. Pat. No. 6,350,158 to Arnett et al., the disclosure of which is hereby incorporated herein in its entirety. Those skilled in this art will recognize that other configurations of jack frames, covers and terminal housings may also be employed with the present invention. Exemplary configurations are illustrated in U.S. Pat. Nos. 5,975,919 and 5,947,772 to Arnett et al. and U.S. Pat. No. 6,454,541 to Hashim et al., the disclosure of each of which is hereby incorporated herein in its entirety.

Figure 2:
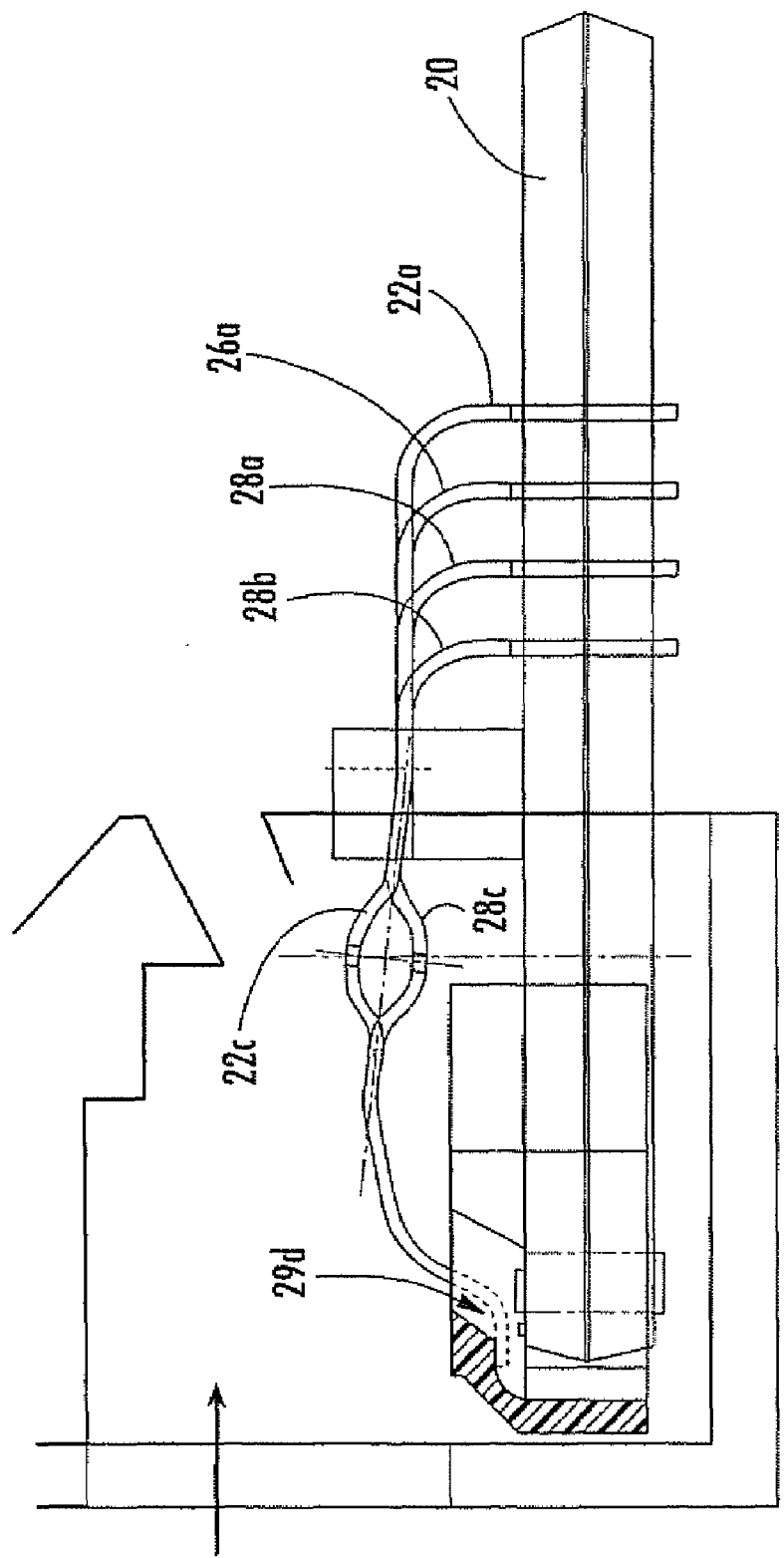
FIG. 2 is a side view of contact wires of the jack of FIG. 1.

In addition, referring still to FIG. 1 and also to FIG. 2, the jack 10 further includes a wiring board 20 formed of conventional materials. The wiring board 20 may be a single layer board or may have multiple layers. The wiring board 20 may be substantially planar as illustrated, or may be non-planar.

Referring again to FIGS. 1 and 1A, contact wires 22a, 22b, 24a, 24b, 26a, 26b, 28a, 28b are attached to the wiring board 20. As described in U.S. Pat. No. 6,350,158 referenced above, the contact wires 22a, 22b, 24a, 24b, 26a, 26b, 28a, 28b have free ends that have substantially the same profile, are substantially transversely aligned in side-by-side relationship, and that extend into the plug aperture 14 to form electrical contact with the terminal blades of a mating plug. The free ends of the contact wires 22a, 22b, 24a, 24b, 26a, 26b, 28a, 28b extend into individual slots 29a–29h in the forward edge portion of the wiring board 20. The contact wires 22a, 22b, 24a, 24b, 26a, 26b, 28a, 28b are arranged in pairs defined by TIA 568B, with wires 22a, 22b (pair 1) being adjacent to each other and in the center of the sequence of wires, wires 24a, 24b (pair 2) being adjacent to each other and occupying the leftmost two positions (from the vantage point of FIG. 1B) in the sequence, wires 28a, 28b (pair 4) being adjacent to each other and occupying the rightmost two positions (from the vantage point of FIG. 1B) in the sequence, and wires 26a, 26b (pair 3) being positioned between, respectively, pairs 1 and 4 and pairs 1 and 2. The wires 22a, 22b, 24a, 24b, 26a, 26b, 28a, 28b are mounted to the wiring board 20 via insertion into respective apertures 32a, 32b, 34a, 34b, 36a, 36b, 38a, 38b, which are arranged in the illustrated embodiment in a "dual diagonal" pattern known to those skilled in this art as described in U.S. Pat. No. 6,196,880 to Goodrich et al., the disclosure of which is hereby incorporated herein in its entirety. Those skilled in this art will appreciate that contact wires or other contacts of other configurations may be used. As one example, contact wires configured as described in aforementioned U.S. Pat. No. 5,975,919 to Arnett et al. may be employed.

Figure 3:
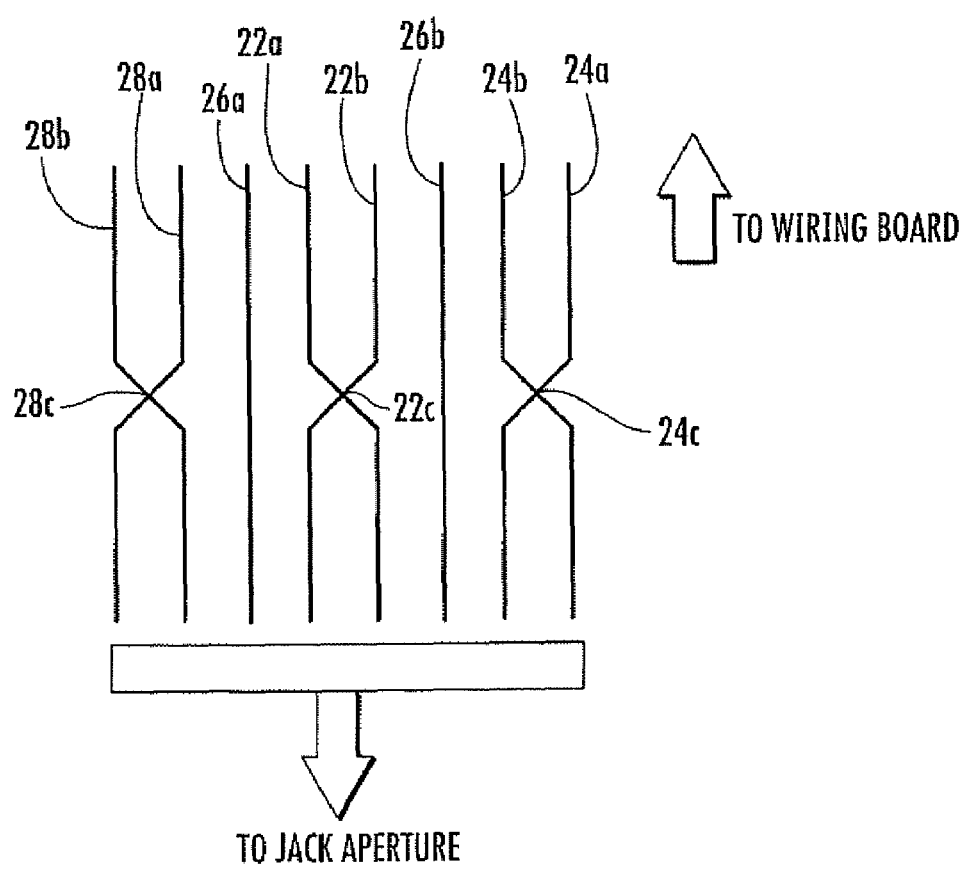
FIG. 3 is a top schematic view of contact wires of the prior art jack of FIG. 1.

As can be seen in FIGS. 1A and 3, each of pairs 1, 2 and 4 that comprise adjacent contact wires include a respective "crossover" 22c, 24c, 28c, i.e., a location in which the contact wires of a pair cross each other without making electrical contact, typically such that the free end of one contact wire of the pair is substantially longitudinally aligned with the fixed end portion of the other contact wire of the pair. The crossovers 22c, 24c, 28c are located approximately in the center of their contact wires (between the free ends of the contact wires and their mounting locations on the wiring board 20). Crossovers are included to provide compensatory crosstalk between contact wires. In the illustrated embodiment, the crossovers are implemented via complementary localized bends in the crossing wires, with one wire being bent upwardly and the other wire being bent downwardly. The presence of a crossover, structural implementations thereof, and its effect on crosstalk are discussed in some detail in the '358 patent described above and U.S. Pat. No. 5,186,647 to Denkmann et al., the disclosure of which is hereby incorporated herein by reference. In this prior art device, the contact wires of pair 3 (wires 26a, 26b) do not include a crossover.

Figure 1B:
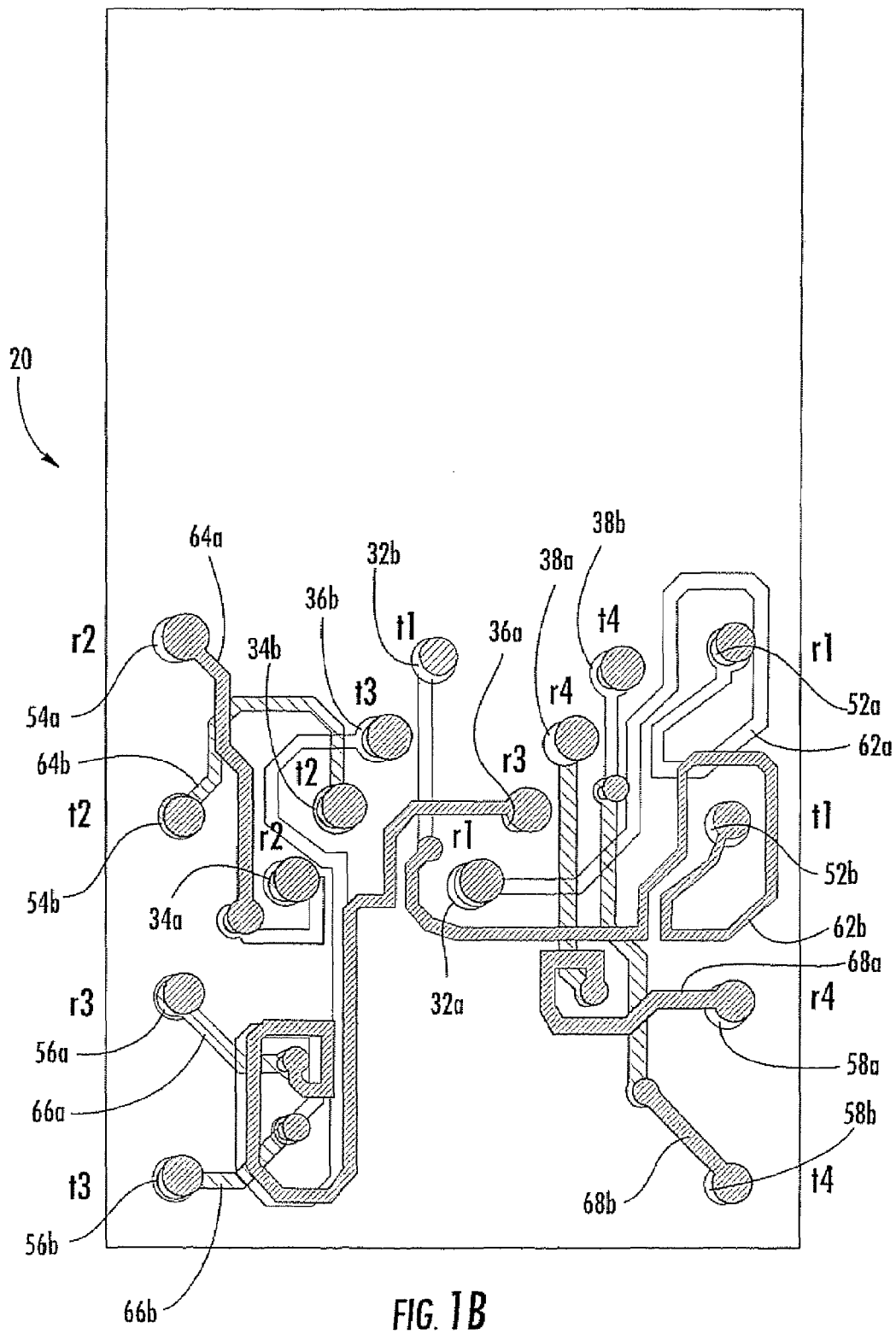
FIG. 1B is a top view of the wiring board of FIG. 1A.

Referring once again to FIGS. 1 and 1A and to FIG. 1B, eight insulation displacement connectors (IDCs) 42a, 42b, 44a, 44b, 46a, 46b, 48a, 48b are inserted into eight respective IDC apertures 52a, 52b, 54a, 54b, 56a, 56b, 58a, 58b. The IDCs are of conventional construction and need not be described in detail herein; exemplary IDCs are illustrated and described in U.S. Pat. No. 5,975,919 to Arnett, the disclosure of which is hereby incorporated by reference herein in its entirety.

Referring now to FIGS. 1A, 1B and 2, the each of the wire apertures 32a, 32b, 34a, 34b, 36a, 36b, 38a, 38b is electrically connected to a respective IDC aperture 52a, 52b, 54a, 54b, 56a, 56b, 58a, 58b via a respective conductor 62a, 62b, 64a, 64b, 66a, 66b, 68a, 68b, thereby interconnecting each of the contact wires 22a, 22b, 24a, 24b, 26a, 26b, 28a, 28b to its corresponding IDC 42a, 42b, 44a, 44b, 46a, 46b, 48a, 48b. The conductors 62a, 62b, 64a, 64b, 66a, 66b, 68a, 68b are formed of conventional conductive materials and are deposited on the wiring board 20 via any deposition method known to those skilled in this art to be suitable for the application of conductors. Some conductors are illustrated as being entirely present on a single layer of the wiring board 20 (for example, conductor 62a), while other conductors (for example, conductor 62*b*) may reside on multiple layers of the wiring board 20; conductors can travel between layers through the inclusion of vias (also known as plated through holes) or other layer-transferring structures known to those skilled in this art.

U.S. Pat. No. 5,967,853 to Hashim (the disclosure of which is hereby incorporated herein in its entirety) describes a technique whereby capacitive compensation is used to simultaneously compensate differential to differential and differential to common mode crosstalk. However, in order to effectively cancel both NEXT and FEXT it is typically necessary to provide both inductive and capacitive compensation. The prior art arrangement of contact wires disclosed in FIGS. 1–3 has been proven to effectively and efficiently provide inductive differential to differential crosstalk compensation. However, it has been determined that this arrangement may be ineffective, and perhaps counterproductive, in providing inductive differential to common mode compensation in the jack 10. More specifically, the prior art arrangement provides inductive differential to differential crosstalk compensation between pairs 1 and 3, pairs 2 and 3, and pairs 4 and 3, but in the development of the present invention it has been recognized that, due to the large physical separation between the conductors of pair 3 and their asymmetric placement relative to pair 2 (and similarly to pair 4), the highest levels of differential to common mode crosstalk in a mating plug, which can be the most problematic to channel performance, tend to occur on pairs 2 and 4 when pair 3 is excited differentially. The differential to common mode crosstalk occurring when any of the pairs 1, 2 and 4 is excited differentially tends to be much less severe, and consequently much less problematic, because the separation between the conductors in each of these pairs is one-third the separation between the conductors of pair 3. In the prior art arrangement of contact wires disclosed in FIGS. 1–3, crossover on each of pairs 1, 2 and 4 inductively compensates for the less severe differential to common mode crosstalk occurring when any of these pairs is differentially excited. However, due to the absence of a crossover on pair 3, this arrangement not only fails to inductively compensate for the more severe common mode crosstalk on pairs 2 and 4 when pair 3 is differentially excited, but can actually exacerbate this problem. This is especially true when the jack receives a conventional plug such as the one illustrated in U.S. Pat. No. 6,250,949 to Lin.

Figure 4:
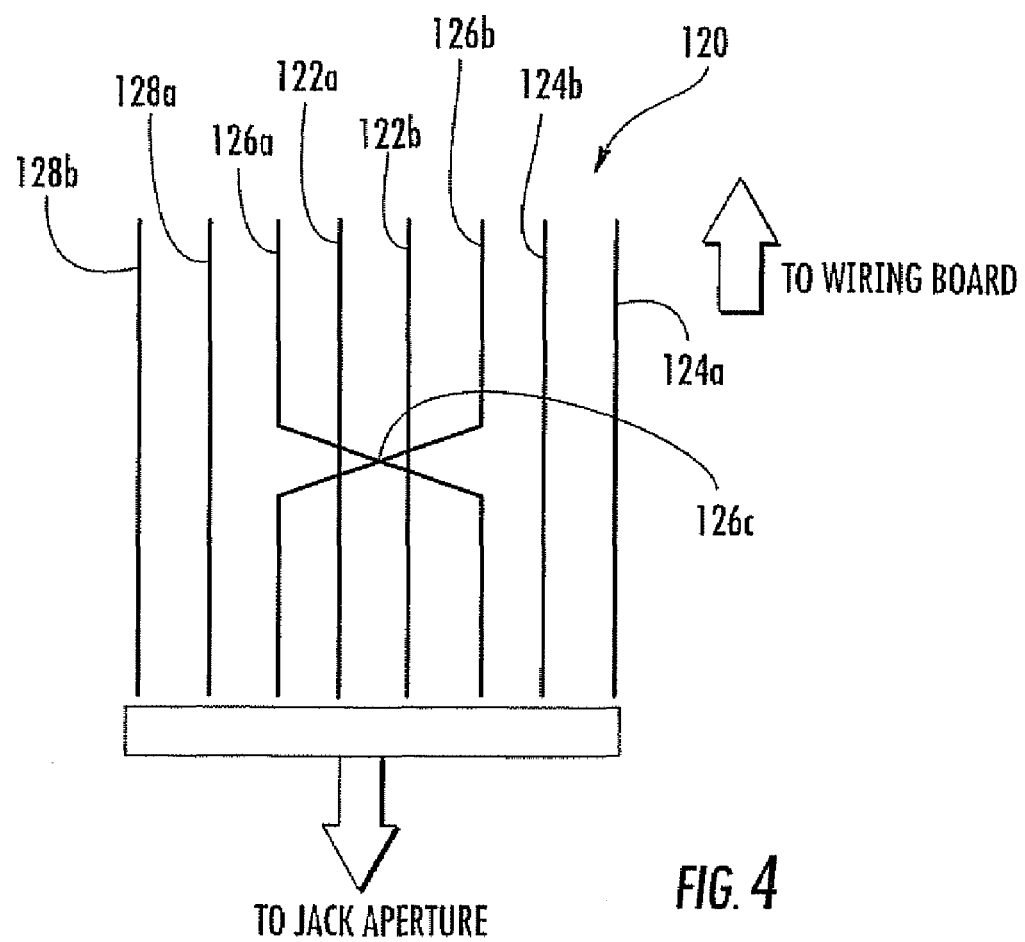
FIG. 4 is a top schematic view of conductors of an embodiment of a communications jack according to the present invention.
Figure 5:
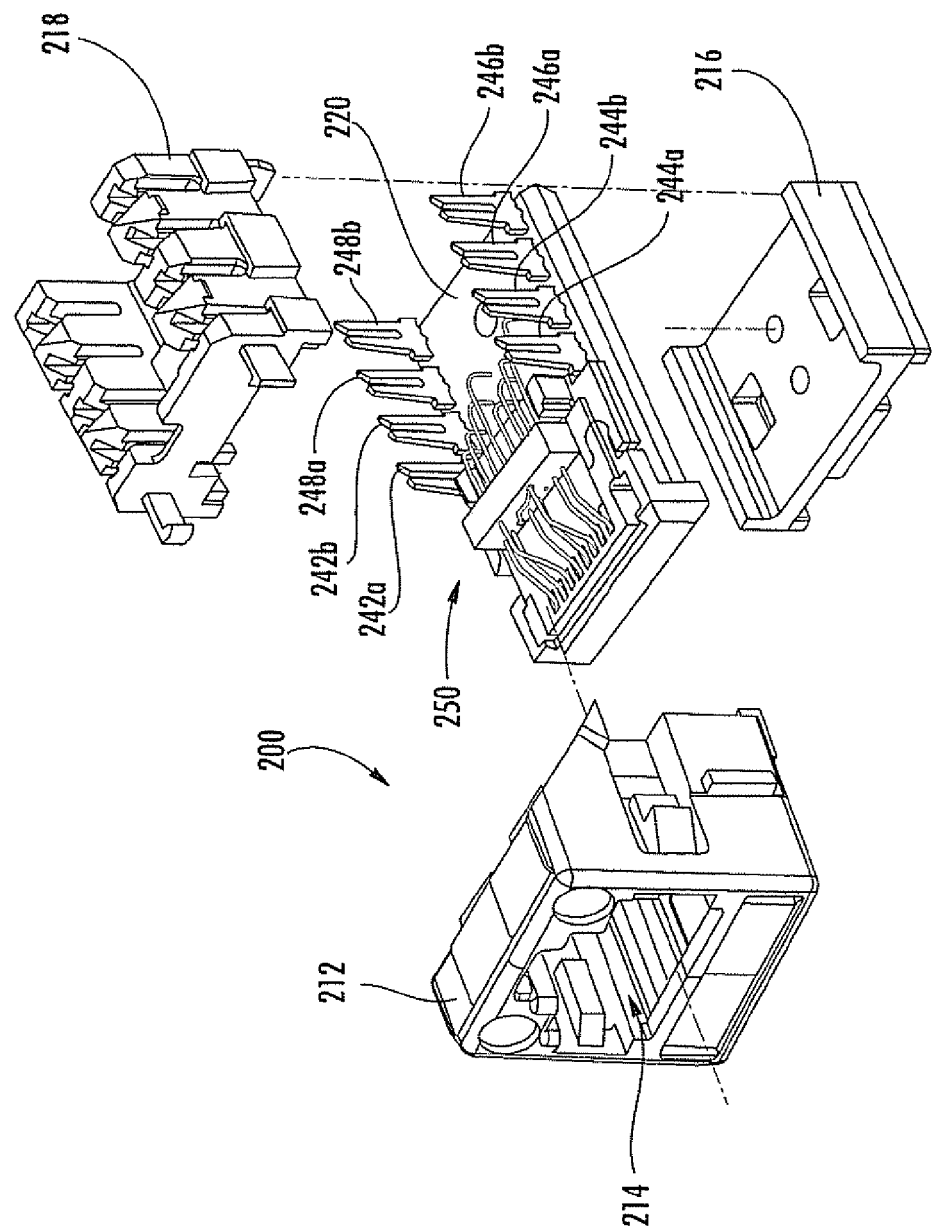
FIG. 5 is a perspective view of a communications jack that includes the conductors of FIG. 4 according to embodiments of the present invention.
Figure 6:
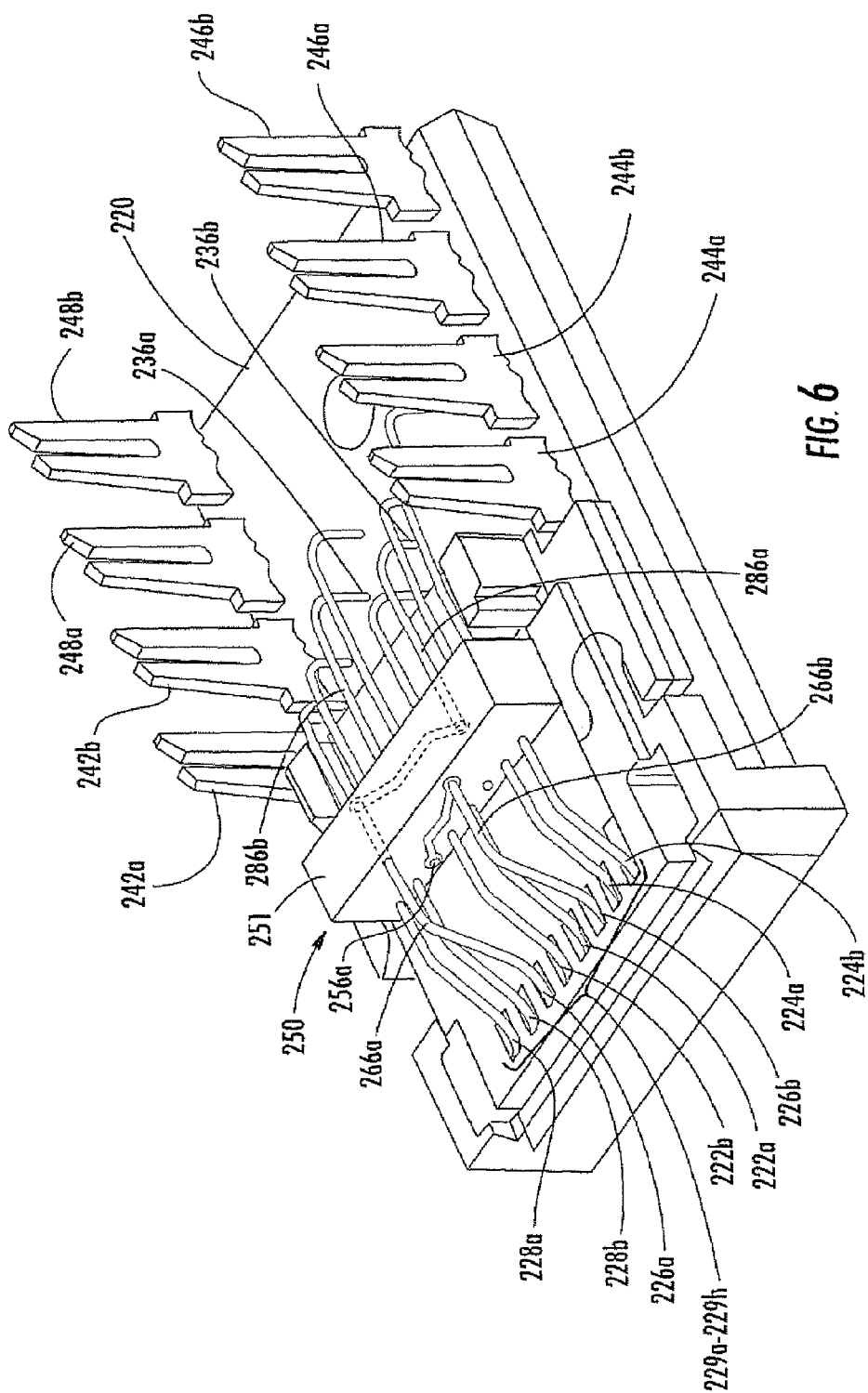
FIG. 6 is an enlarged perspective view of the communications jack of FIG. 5.

Turning now to FIG. 4, an arrangement of wires according to embodiments of the present invention, designated broadly at 120, is illustrated schematically therein. The wiring arrangement 120 includes eight contact wires 122*a*, 122*b*, 124*a*, 124*b*, 126*a*, 126*b*, 128*a*, 128*b* that comprise, respectively, wire pairs 1, 2, 3 and 4. In contrast to the prior art arrangement of contact wires described above, in this embodiment the contact wires 122*a*, 122*b* of pair 1, the contact wires 124*a*, 124*b* of pair 2, and the contact wires 128*a*, 128*b* of pair 4 do not include a crossover, while the contact wires 126*a*, 126*b* include a crossover 126*c*.

Like the prior arrangement, this arrangement of contact wires should provide compensatory inductive differential to differential crosstalk between pairs 1 and 3, pairs 2 and 3, and pairs 4 and 3. In addition, this arrangement, although not inductively compensating for the less severe differential to common mode crosstalk occurring when any of the pairs 1, 2 and 4 is differentially excited, can provide inductive compensation for the highly problematic differential to common mode crosstalk occurring on pairs 2 and 4 when pair 3 is differentially excited. Because the most problematic differential to common mode crosstalk can be inductively compensated, a jack employing this arrangement can meet higher performance standards, particularly at elevated frequencies.

One exemplary implementation of this arrangement is illustrated and described in co-assigned and co-pending U.S. patent application Ser. No. 11/088,044, filed Mar. 23, 2005, the disclosure of which is hereby incorporated herein in its entirety. The implementation illustrated therein employs supports posts that support the contact wires of pair 3 as they cross over and under the wires of pair 1. However, there may be some manufacturing difficulties with this implementation.

Another exemplary implementation of the arrangement of FIG. 4 is illustrated in FIGS. 5–9, in which a jack 200 according to embodiment of the present invention is shown. The jack 200 includes a jack frame 212 having a plug aperture 214, a cover 216 and a terminal housing 218. A wiring board 220 includes IDCs 242*a*–248*b* mounted thereon. Conductors 222*a*–228*b* in the form of contact wires are mounted to the wiring board 220 in side-by-side and generally parallel relationship. As used herein, "generally parallel" with reference to the conductors means that, from the vantage point of FIG. 8, substantial portions of the conductors are parallel to one another. Conductors that are "aligned" have free and fixed ends that are substantially collinear from the vantage point of FIG. 8, and conductors that are "non-aligned" have free and fixed ends that are not substantially collinear from the vantage point of FIG. 8.

At their free ends, the conductors 222*a*–228*b* fit within slots 229*a*–229*h* located at the forward end of the wiring board 220 and are positioned to mate with the blades of a plug inserted into the plug aperture 214. With the exception of the crossover region 250, described in greater detail below, the conductors 222*a*–228*b* follow generally the same profile (from the vantage point of FIG. 7) until they bend downwardly into their respective mounting apertures in the wire board 220. Conductive traces on the wiring board 220 provide signal paths between the conductors 222*a*–228*b* and the IDCs 242*a*–248*b*.

Figure 7:
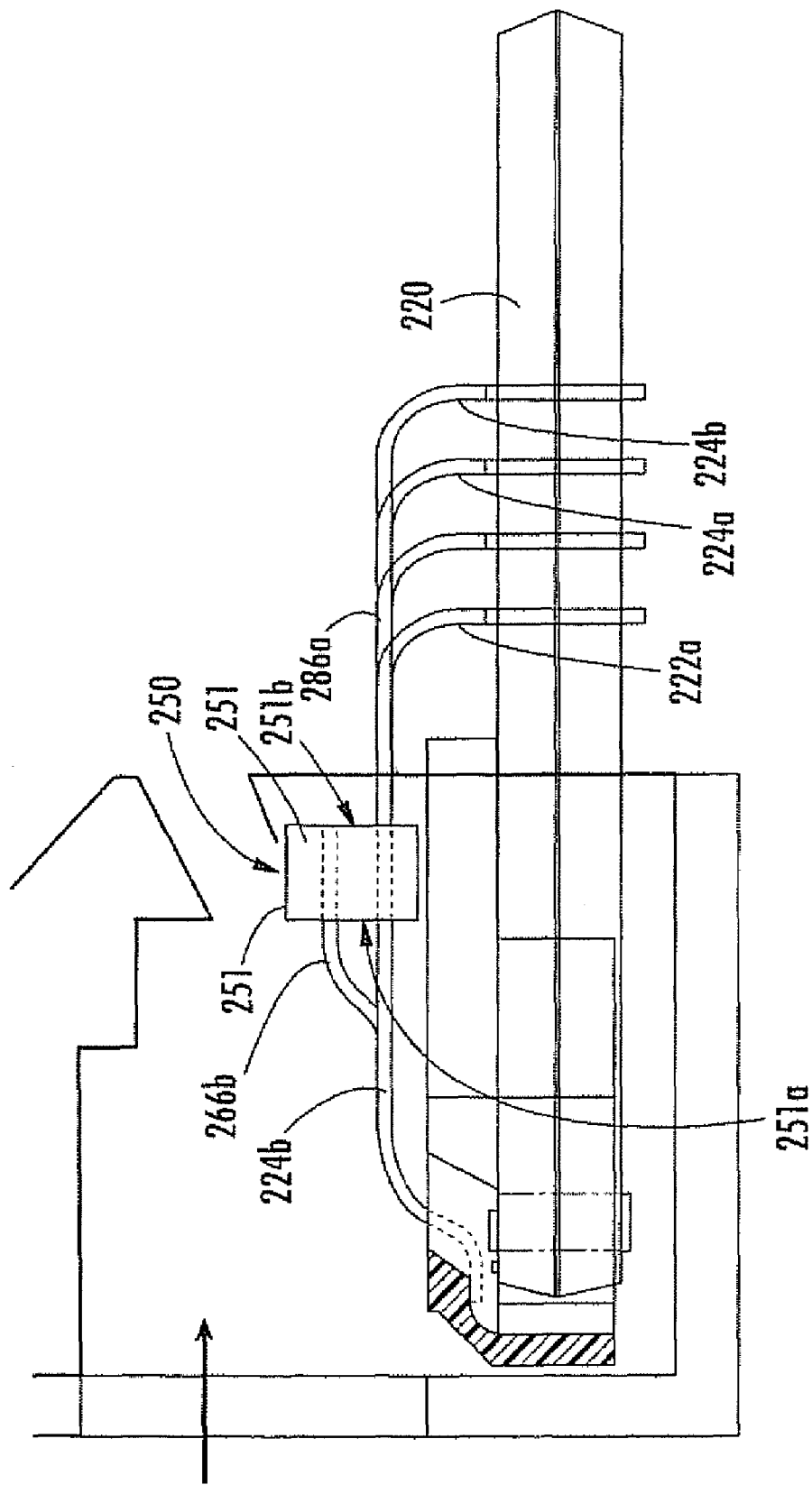
FIG. 7 is a partial side view of the jack of FIG. 6.
Figure 7A:
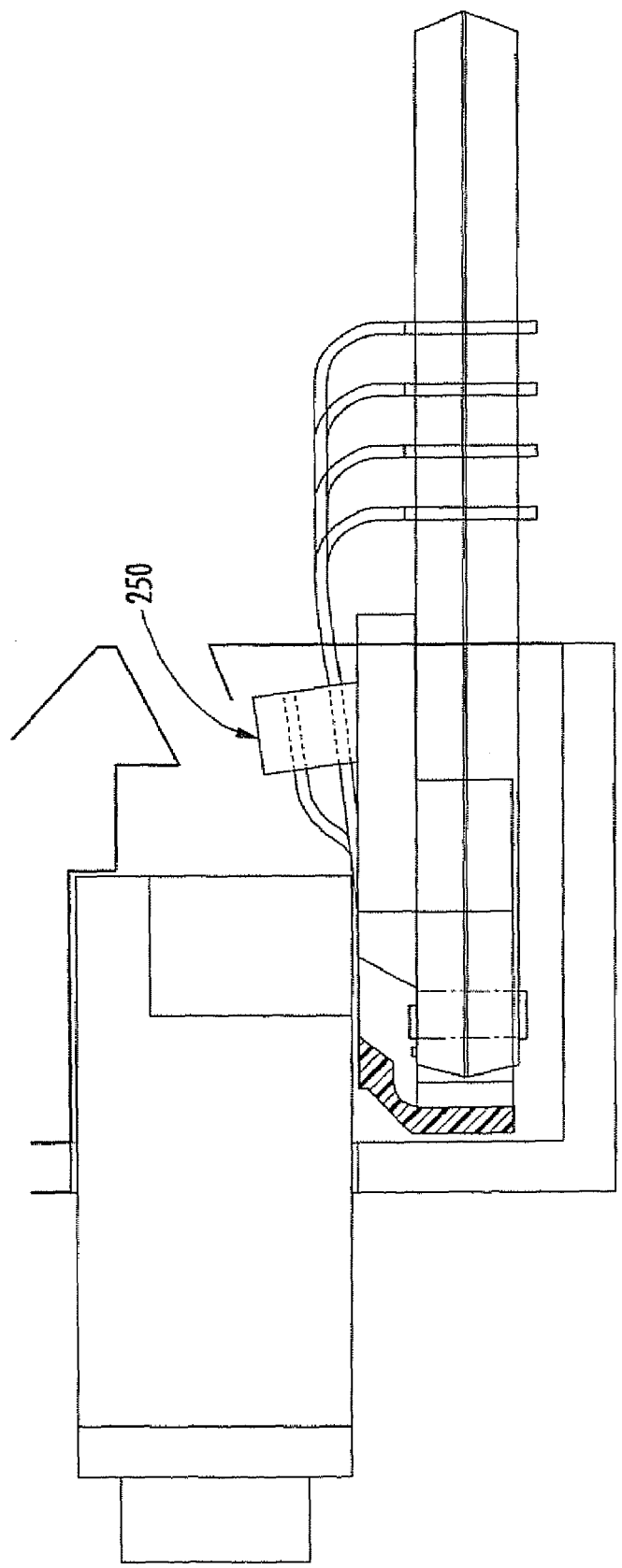
FIG. 7A is a partial side view of the jack of FIG. 6 after a plug has been inserted into the jack.

Referring now to FIGS. 6–9, the crossover region 250 includes a "floating" printed wiring board (PWB) 251 that is suspended above the wiring board 220 by the conductors 222*a*–228*b* and is generally perpendicular to the wiring board 220 and the conductors 222*a*–228*b*. As shown in FIGS. 7 and 7A, the lower edge of the PWB 251 is spaced apart from the upper surface of the wiring board 220, such that the PWB 251 is free to move upon deflection of the conductors 222*a*–228*b* (as when a mating plug is inserted into the jack 200), although in some embodiments the lower edge of the PWB 251 may contact the wiring board 220, and in other embodiments there may be a clearance opening in the wiring board 220 to permit the lower edge of PWB 251 to move to a position below the upper surface of the wiring board 220. The distance between the PWB 251 and the locations where the conductors 222*a*, 222*b* intercept a mating plug is about 0.154 inches, but those skilled in this art will appreciate that a different distance may also be suitable with the present invention. Typically the conductors are between about 0.648 and 0.828 inches in length, and the crossover region 250 occurs between about 0.3 and 0.4 inches from the free ends of the contact wires 222*a*–228*b*.

Referring now to FIG. 9, the PWB 251, which can be rigid or flexible and is typically formed of a dielectric material, includes eight bores 252*a*, 252*b*, 254*a*, 254*b*, 256*a*, 256*b*, 258*a*, 258*b* in a lower row, and two bores 256*c*, 256*d* in an upper row that extend from the front surface 251*a* of the PWB 251 to the rear surface 251*b* thereof. Six of the conductors, namely those that comprise pairs 1, 2 and 4 (i.e., conductors 222a, 222b, 224a, 224b, 228a, 228b) pass directly through respective bores 252a, 252b, 254a, 254b, 258a, 258b, and follow relatively straight paths (see FIGS. 7 and 8). The PWB 251 is sized such that its lower edge is spaced from the upper surface of the wiring board 220 (hence the term "floating" PWB). The bores 252a, 252b, 254a, 254b, 258a, 258b are sized such that the conductors passing therethrough can slide relative to the PWB 251.

In contrast to the other conductors, each of the conductors 226a, 226b of pair 3 includes an approaching segment 266a, 266b that veers upwardly from the path defined by the other conductors and passes into a respective bore 256c, 256d of the upper row of bores. Also, each of the conductors 226a, 226b includes an exiting segment 286a, 286b that exits a respective bore 256a, 256b and travels therefrom to the wiring board 220 (each of the exiting segments 286a, 286b follows generally the profile of, respectively, the conductors 228b, 224a as they exit the PWB 251). The bores 256a, 256b are plated with a conductive material. All of the bores 256a–256d are sized for a snug fit with their respective segments.

The front surface 251a of the PWB 251 includes a conductive trace 276b that extends between the bore 256d of the upper row of bores and the bore 256a of the lower row of bores (notably, the path followed by the trace 276b crosses over the conductors 222a, 222b of pair 1). Thus, a conductive path for the conductor 226b is created between the approaching segment 266b, the conductive trace 276b, the bore 256a, and the exiting segment 286b. Similarly, the rear surface 251b of the PWB 251 includes a conductive trace 276a that extends between the bore 256c of the upper row of bores and the bore 256b of the lower row of bores (and crosses over the conductors 222a, 222b). Thus, a conductive path for the conductor 226a is created between the approaching segment 266a, the bore 256c, the conductive trace 276a, and the exiting segment 286a. It can be seen that the conductive traces 276a, 276b are electrically insulated from each other, which enables the conductors 226a, 226b to cross without making electrical contact.

It can be seen that the conductive paths of the conductors 226a, 226b (i.e., the conductors of pair 3) are able to "cross over" each other (i.e., the free end of each of the conductors 226a, 226b of pair 3 is aligned with the fixed end of the other conductor 226b, 226a of pair 3), and the conductors of pair 1 in order to create the schematic arrangement shown in FIG. 4. Thus, the illustrated embodiment has the advantage of enabling the commencement of the inductive differential to differential and differential to common mode compensations at minimal delay from the corresponding crosstalk sources, which can be important to effective crosstalk compensation.

It should also be understood that a floating PWB may also be employed for generating cross-over configurations for other pairs of conductors. Furthermore, the floating PWB can be a multi-layer board with the crossover traces residing on any of its layers. It should also be understood that, rather than having selected conductors slide through bores on the floating PWB, any or all of these conductors can comprise approaching and exiting segments that fixedly terminate into plated bores on the PWB, with signal path completion achieved by conductive traces on the PWB or by conductive plating within a single bore. Moreover, it should be recognized that the PWB may be sized such that only the conductors of pairs 1 and 3 are captured therein, with the result that the conductors of pairs 2 and 4 simply extend unimpeded from free end to fixed end. Alternatively, the PWB and contacts can be sized or shaped such that only the conductors of pair 3 are captured, with the result that conductors of pairs 1, 2 and 4 simply extend unimpeded from free end to fixed end. In addition, the PWB may include other devices, such as parallel plate or interdigital capacitors, that provide another stage of capacitive crosstalk compensation.

The skilled artisan will recognize that, although eight contact wires are illustrated and described herein, other numbers of contact wires may be employed. For example, 16 contact wires may be employed, and one or more crossovers that cross over a pair of contact wires sandwiched therebetween may be included in those contact wires.

Further, those skilled in this art will recognize that other jack configurations may also be suitable for use with the present invention. For example, as discussed above, other configurations of jack frames, covers and terminal housings may also be employed with the present invention. As another example, the contact wires may have a different profile (an exemplary alternative profile is depicted in U.S. Pat. No. 5,975,919 to Arnett et al.), or they may mount in locations that do not follow the "dual diagonal" mounting scheme illustrated herein (an exemplary alternative in which the contact wires are staggered is illustrated in U.S. Pat. No. 6,116,964 to Goodrich et al). As a further example, the IDCs may mount in a different pattern on the wiring board, or some other type of connector may be used. Those skilled in this art will also recognize that embodiments of the wiring board described above may be employed in other environments in which a communications jack may be found. For example, jacks within a patch panel or series of patch panels may be suitable for use with such wiring boards. Other environments may also be possible.

The configuration illustrated and described herein can provide connectors, and in particular communications jacks, that exhibit improved crosstalk characteristics, particularly at elevated frequencies. For example, a connector such as that illustrated in FIGS. 5–9 and mated with a conventional plug may have channel alien NEXT of less than −60 dB power sum at 100 MHz, and less than −49.5 dB power sum at 500 MHz.

Also those skilled in the art will recognize that, in situations in which it may not be critical to implement the differential to differential crosstalk compensation between pairs 3 and 2 and between pairs 3 and 4 in the contact wires, it is possible to provide instead compensation for the common mode crosstalk induced on pair 3, or pair 1, when either of pair 2 or pair 4 is differentially excited, by modifying the contact wire crossover scheme of FIG. 4 to include crossovers in pairs 2 and 4 in addition to the crossover on pair 3.

Further, those skilled in the art will recognize the reciprocity that exists between the differential to common mode crosstalk induced on a first pair, when a second pair is excited differentially, and the common mode to differential signal induced on the second of these pairs when the first of these pairs is excited common-modally, with the common mode to differential crosstalk equaling the differential to common mode crosstalk multiplied by a constant, that constant being the ratio of the differential to common mode impedances. Consequently, when an improvement occurs, due to the current invention, in the differential to common mode crosstalk between two pairs when one of these pairs is excited differentially, a corresponding improvement occurs in the common mode to differential crosstalk between these two pairs, when the other of these pairs is excited common-modally.

The foregoing is illustrative of the present invention and is not to be construed as limiting thereof. Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. A communications connector, comprising:
   a dielectric mounting substrate;
   a plurality of contact wires mounted in the mounting substrate, the contact wires including a fixed end portion mounted in the mounting substrate and a free end portion; and
   a floating wiring board positioned between the fixed and free end portions of at least some of the contact wires, the wiring board including a first plated hole that receives a first intermediate end of a first contact wire of the plurality of contact wires, a second plated hole that receives a second intermediate end of the first contact wire and a first conductive trace that electrically connects the first and second intermediate ends of the first contact wire;
   wherein the fixed end portion and the free end portion of the first contact wires are in a non-aligned relationship.

2. The communications connector defined in claim 1, wherein the wiring board includes a second conductive trace that is electrically insulated from the first conductive trace, and wherein a second of the plurality of contact wires is electrically connected with the second conductive trace such that the fixed end portion and the free end portion of the second contact wire are in non-aligned relationship.

3. The communications connector defined in claim 2, wherein the first and second contact wires form a crossover on the wiring board.

4. The communications connector defined in claim 2, wherein the first and second contact wires sandwich a third contact wire and a fourth contact wire of the plurality of contact wires.

5. The communications connector defined in claim 4, wherein the third and fourth contact wires lack a crossover.

6. The communications connector defined in claim 2, wherein the wiring board has multiple surfaces, and wherein the first conductive trace is positioned on a first surface, and the second conductive trace is positioned on a second surface.

7. The communications connector defined in claim 4, wherein a fifth contact wire and a sixth contact wire of the plurality of contact wires are positioned adjacent the first contact wire, and a seventh contact wire and an eighth contact wire of the plurality of contact wires are positioned adjacent the second contact wire.

8. The communications connector defined in claim 7, wherein the third and fourth contact wires pass through bores in the wiring board.

9. The communications connector defined in claim 7, wherein the fifth, sixth, seventh and eighth contact wires lack a crossover.

10. The communications connector defined in claim 2, wherein the wiring board is suspended spaced apart from the mounting substrate by the first and second contact wires.

11. The communications connector defined in claim 3, wherein the first and second contact wires are between 0.648 and 0.828 inches in length, and wherein the wiring board creating the crossover is positioned between 0.3 and 0.4 inches from the free end portions of the first and second contact wires.

12. A communications connector, comprising:
    a dielectric mounting substrate;
    a plurality of conductors mounted in the mounting substrate, each of the conductors including a fixed end portion mounted in the mounting substrate and a free end portion;
    a wiring board positioned between the fixed and free end portions of at least some of the conductors;
    wherein the wiring board includes a first conductive trace that comprises a central portion of a first of the plurality of conductors and a second conductive trace that comprises a central portion of a second of the plurality of conductors,
    wherein the fixed end portion of the first of the plurality of conductors and the free end portion of the second of the plurality of conductors are substantially aligned, and the fixed end portion of the second of the plurality of conductors and the free end portion of the first of the plurality of conductors are substantially aligned.

13. The communications connector defined in claim 12, wherein the first and second conductors form a crossover on the wiring board.

14. The communications connector defined in claim 12, wherein the first and second conductors sandwich a third conductor and a fourth conductor of the plurality of conductors.

15. The communications connector defined in claim 14, wherein the third and fourth conductors lack a crossover.

16. The communications connector defined in claim 12, wherein the wiring board has multiple surfaces, and wherein the first conductive trace is positioned on a first surface, and the second conductive trace is positioned on a second surface.

17. The communications connector defined in claim 12, wherein a third conductor and a fourth conductor of the plurality of conductors are sandwiched between the first and second conductors, a fifth conductor and a sixth conductor of the plurality of conductors are positioned adjacent the first conductor, and a seventh conductor and an eighth conductor of the plurality of conductors are positioned adjacent the second conductor.

18. The communications connector defined in claim 15, wherein the third and fourth conductors pass through bores in the wiring board.

19. The communications connector defined in claim 12, wherein the wiring board comprises a floating wiring board that is supported by the first and second conductors.

20. The communications connector defined in claim 12, wherein the first and second conductors are between 0.648 and 0.828 inches in length, and wherein the wiring board creating the crossover is positioned between 0.3 and 0.4 inches from the free end portions of the first and second conductors.

21. A communications connector, comprising:
    a dielectric mounting substrate;
    a plurality of contact wires mounted in the mounting substrate, each of the contact wires including a fixed end portion mounted in the mounting substrate and a free end portion;
    a wiring board positioned between the fixed and free end portions of the contact wires, the wiring board including first and second conductive traces that are electrically insulated from each other;

wherein a first of the plurality of contact wires comprises a first wire segment that includes the fixed end portion, a second wire segment that includes the free end portion, and the first conductive trace which electrically connects the first and second wire segments, and wherein a second of the plurality of contact wires comprises a third wire segment that includes the fixed end portion, a fourth wire segment that includes the free end portion, and the second conductive trace which electrically connects the third and fourth wire segments, and wherein the first and second conductive traces are arranged to create a crossover between the first and second contact wires.

22. The communications connector defined in claim 21, wherein the first and second contact wires sandwich a third contact wire and a fourth contact wire of the plurality of contact wires.

23. The communications connector defined in claim 22, wherein the third and fourth contact wires lack a crossover.

24. The communications connector defined in claim 21, wherein the wiring board has multiple surfaces, and wherein the first conductive trace is positioned on a first surface, and the second conductive trace is positioned on a second surface.

25. The communications connector defined in claim 21, wherein a third contact wire and a fourth contact wire of the plurality of contact wires are sandwiched between the first and second contact wires, a fifth contact wire and a sixth contact wire of the plurality of contact wires are positioned adjacent the first contact wire, and a seventh contact wire and an eighth contact wire of the plurality of contact wires are positioned adjacent the second contact wire.

26. The communications connector defined in claim 22, wherein the third and fourth contact wires pass through bores in the wiring board.

27. The communications connector defined in claim 25, wherein the fifth, sixth, seventh and eighth contact wires lack a crossover.

28. The communications connector defined in claim 21, wherein the wiring board is suspended spaced apart from the mounting substrate by the first and second contact wires.

29. The communications connector defined in claim 1, wherein the floating wiring board further comprise at least one capacitor formed between portions of two of the plurality of contact wires.

30. The communications connector defined in claim 12, wherein the dielectric mounting substrate comprises a second wiring board.

31. The communications connector defined in claim 12, wherein the wiring board comprises a floating wiring board.

32. The communications connector defined in claim 31, wherein the floating wiring board further comprise at least one capacitor formed between portions of two of the plurality of conductors.

33. A communications jack, comprising:
a housing having a plug aperture;
a floating wiring board mounted at least partially within the plug aperture; and
a plurality of contacts that are configured to mate with respective of a plurality of contacts of a communications plug when the plug is inserted into the plug aperture,
wherein at least some of the plurality of contacts are electrically connected to respective of a plurality of conductive traces on the floating wiring board, and
wherein a position of the floating wiring board within the plug aperture changes when the plug is inserted into the plug aperture.

34. The communications jack of claim 33, wherein the floating wiring board comprises a flexible wiring board.

35. The communications jack of claim 34, wherein the plurality of contacts comprises eight contacts that are configured as four differential pairs of contacts, and wherein the conductive traces on the flexible wiring board associated with at least one of the differential pairs cross over each other.

36. The communications jack of claim 34, wherein the flexible circuit board includes at least one capacitor.

37. A contact for a communications jack, the contact comprising:
a first wire that includes a contact area for mating with a contact of a mating communications plug and a first end that is mounted in a floating wiring board;
a second wire that includes a first end that is mounted in the floating printed wiring board and a second end that is mounted in a dielectric substrate; and
wherein the floating wiring board includes a first conductive trace that electrically connects the first wire to the second wire,
wherein the contact is a cantilevered contact having a fixed portion and a deflectable portion, wherein the first wire and the first conductive trace are part of the deflectable portion of the contact.

38. The contact of claim 37, wherein the dielectric substrate comprises a fixed wiring board.

39. The contact of claim 37, wherein the floating wiring board is located immediately adjacent to the contact area of the first wire.

40. The contact of claim 37, wherein the first wire is in a first plane and the second wire is in a second plane that is different than, and substantially parallel to, the first plane.

41. The contact of claim 37, in combination with a second contact that comprises:
a third wire that includes a contact area for mating with a contact of a mating communications plug and a first end that is mounted in the floating wiring board;
a fourth wire that includes a first end that is mounted in the floating printed wiring board and a second end that is mounted in the dielectric substrate; and
wherein the floating wiring board includes a second conductive trace that electrically connects the third wire to the fourth wire.

42. The contact of claim 41, wherein the first conductive trace and the second conductive trace cross each other on the floating wiring board.

43. The contact of claim 41, wherein the first wire is in a first plane and the second wire is in a second plane that is different than, and substantially parallel to, the first plane, and wherein the third wire is in the first plane and the fourth wire is in the second plane.

44. The contact of claim 41, wherein the first wire is in a first plane and the second wire is in a second plane that is different than, and substantially parallel to, the first plane, and wherein the third wire is in the second plane and the fourth wire is in the first plane.

* * * * *

UNITED STATES PATENT AND TRADEMARK OFFICE
CERTIFICATE OF CORRECTION

PATENT NO.        : 7,168,993 B2                                     Page 1 of 1
APPLICATION NO.   : 11/139768
DATED             : January 30, 2007
INVENTOR(S)       : Hashim It is certified that error appears in the above-identified patent and that said Letters Patent is hereby corrected as shown below:

Item 56 on Title Page
U.S. Patent Documents please add

Including: US-5,587,884   12/24/1996   Raman
          US-5,299,956   04/05/1994   Brownell et al.
          US-6,716,964   04/06/2004   Chinnadural
          US-5,362,257   11/08/1994   Neal et al.
          US-5,911,602   06/15/1999   Vaden
          US-6,443,777   09/03/2002   McCurdy et al.
          US-5,310,363   05/10/1994   Brownell et al.
          US-6,120,330   09/19/2000   Gwiazdowski
          US-5,971,813   10/26/1999   Kunz et al.
          US-5,779,503   07/14/1998   Tremblay et al.
          US-6,379,198   04/30/2002   Arnett et al.
          US-6,592,395   07/15/2003   Brown et al.
          US-5,618,185   04/08/1997   Aekins
          US-5,432,484   06/11/1995   Klas et al.
          US-5,414,393   05/09/1995   Rose et al.
          US-5,547,405   08/20/1996   Pinney et al.
          US-6,017,247   01/25/2000   Gwiazdowski
          US-5,326,284   07/05/1994   Bohbot et al.
          US-5,362,257   11/08/1994   Neal et al.

Signed and Sealed this

Seventeenth Day of July, 2007

JON W. DUDAS
*Director of the United States Patent and Trademark Office*